(12) United States Patent
Tanabe

(10) Patent No.: US 7,057,391 B1
(45) Date of Patent: Jun. 6, 2006

(54) MAGNETIC RESONANCE IMAGING SYSTEM

(75) Inventor: Hajime Tanabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/116,372

(22) Filed: Apr. 28, 2005

(30) Foreign Application Priority Data

Nov. 12, 2004 (JP) .............................. 2004-329185

(51) Int. Cl.
*G01V 3/00* (2006.01)
(52) U.S. Cl. ....................................... 324/318; 324/320
(58) Field of Classification Search ................ 335/216, 335/296–301; 324/318–320
See application file for complete search history.

(56) References Cited

U.S. PATENT DOCUMENTS

| | | | | |
|---|---|---|---|---|
| 5,332,972 | A * | 7/1994 | Takenouchi ................... | 324/318 |
| 5,361,054 | A * | 11/1994 | Knuttel ........................ | 335/216 |
| 5,568,110 | A * | 10/1996 | Dorri et al. .................. | 335/216 |
| 5,939,962 | A * | 8/1999 | Tahara et al. ................. | 335/216 |
| 6,147,494 | A * | 11/2000 | Ham ............................ | 324/318 |
| 6,498,488 | B1 * | 12/2002 | Takeshima et al. .......... | 324/318 |
| 6,504,372 | B1 * | 1/2003 | Cline .......................... | 324/319 |
| 6,522,144 | B1 * | 2/2003 | Boskamp .................... | 324/318 |
| 6,556,011 | B1 * | 4/2003 | Yui .............................. | 324/318 |
| 6,570,475 | B1 * | 5/2003 | Lvovsky et al. ............. | 335/216 |
| 6,580,346 | B1 * | 6/2003 | Takeshima et al. .......... | 335/216 |
| 6,618,606 | B1 * | 9/2003 | Overweg et al. ............. | 600/410 |
| 6,674,284 | B1 * | 1/2004 | Endt ............................ | 324/318 |
| 6,741,078 | B1 * | 5/2004 | Overweg .................... | 324/318 |
| 6,911,821 | B1 * | 6/2005 | Goldie ........................ | 324/318 |
| 6,933,723 | B1 * | 8/2005 | Schulz et al. ............... | 324/318 |
| 6,970,062 | B1 * | 11/2005 | Mulder ........................ | 335/300 |
| 2002/0050820 | A1 * | 5/2002 | Overweg .................... | 324/318 |
| 2002/0060569 | A1 * | 5/2002 | Takeshima et al. .......... | 324/318 |
| 2002/0079894 | A1 * | 6/2002 | Boskamp .................... | 324/318 |
| 2005/0068032 | A1 * | 3/2005 | Harvey et al. .............. | 324/318 |
| 2005/0083056 | A1 * | 4/2005 | Harvey et al. .............. | 324/318 |
| 2005/0104700 | A1 * | 5/2005 | Mulder ........................ | 335/299 |
| 2005/0146407 | A1 * | 7/2005 | Watanabe et al. ........... | 335/216 |
| 2005/0190030 | A1 * | 9/2005 | Watanabe et al. ........... | 335/296 |

FOREIGN PATENT DOCUMENTS

| | | |
|---|---|---|
| JP | 04-285534 | 10/1992 |
| JP | 2000-102518 | 4/2000 |
| WO | 99/21476 | 5/1999 |

* cited by examiner

Primary Examiner—Ramon M. Barrera
(74) Attorney, Agent, or Firm—Buchanan Ingersoll PC

(57) ABSTRACT

A magnetic resonance imaging system is provided in which the two contradictory requirements, i.e., enhancing the feeling of being not confined by enlarging the subject-insertion space and decreasing magnetomotive force of the superconductive coils by bringing the superconductive coils as close as possible to a subject, can be met in a good balance.

In a magnetic resonance imaging system that includes a superconductive electromagnetic device for generating a static magnetic field to be applied to a subject, a gradient-magnetic-field coil for forming a gradient magnetic field by tilting the magnetic-field strength of the static magnetic field, and a radio-frequency coil for transmitting a radio-frequency magnetic field to the subject and then receiving nuclear magnetic-resonance signals from the subject, a vacuum container for the superconductive electromagnetic device thereof has a recess; the gradient-magnetic-field coil and the radio-frequency coil thereof are accommodated in the recess; and a cosmetic cover that is fit into the recess and is supported by the wall surfaces of the recess is included therein.

5 Claims, 3 Drawing Sheets

MAGNETIC RESONANCE IMAGING SYSTEM

BACKGROUND OF THE INVENTION

1. Field of the Invention

The present invention belongs to a technological field related to magnetic resonance imaging systems for performing medical tomography by means of magnetic resonance phenomena, and particularly to a cosmetic cover for a superconductive electromagnetic device.

2. Description of the Related Art

Magnetic resonance imaging systems utilizing a superconductive electromagnetic device include tunnel-type and open-type systems when categorized according to the contours of vacuum containers for incorporating superconductive coils and the like. The vacuum container for a tunnel-type system has a cylindrical contour and a bore into which a subject is inserted. In contrast, the vacuum containers for an open-type system are in a top-and-bottom pair or in a left-and-right pair, facing each other, and a subject is inserted into the space between the facing vacuum containers.

In the open-type system, the two facing vacuum containers accommodate a subject between them, and the circumference of the subject-insertion space is not closed. As such, the open-type system is characterized by providing subjects with feeling of being not confined, whereby it has the advantage of providing claustrophobic patients and children with feeling of security. In addition, the open-type system has an advantage in terms of a subject-positioning work or of the application thereof to the IVR (Interventional Radiology) in which medical treatments are practiced with created images being observed.

The subject-insertion space of a current open-type system has a height of 38 through 55 cm. When this height is close to the lower limit (38 cm), even the open-type system could make the subjects feel being confined. The expansion of this height merely by several centimeters could abate the feeling of being confined of the subjects. Therefore, magnetic resonance imaging systems are required to eliminate the feeling of being confined of the subjects, by enlarging the subject-insertion space as large as possible.

In contrast, the subject-insertion bore of a current tunnel-type system has a diameter of about 60 through 70 cm. It goes without saying that this diameter (i.e., the subject-insertion space) is also required to be expanded as much as possible to eliminate the feeling of being confined of the subjects.

Meanwhile, a magnetic resonance imaging system is required to decrease magnetomotive force of its superconductive coils by bringing the superconductive coils as close as possible to a subject. This impairs feeling of not being confined of a subject. In other words, two contradictory things are required of a magnetic resonance imaging system, i.e., providing a subject with the feeling of not being confined and decreasing the magnetomotive force of the superconductive coils.

A first conventional magnetic resonance imaging system, in an open-type, has top and bottom static magnet field generating sources the respective total magnetic moments of which are asymmetric. In this way, the region of a uniform static magnetic field is shifted downwards, thereby enlarging the space over the subject (e.g., refer to International Publication No. 99/21476/panphlet). A second conventional magnetic resonance imaging system, in a tunnel-type, has gradient-magnetic-field coils the materials of which are asymmetrically arranged in the direction of the static magnetic field. In this way, the respective edges, at the head side of a subject, of the gradient-magnetic-field coils and radio frequency coils can be trued up, whereby the space over the head of the subject is enlarged, by devising a cosmetic cover at the head side of the subject (e.g., refer to Japanese Laid-Open Patent Publication 2000-102518).

SUMMARY OF THE INVENTION

However, in the first conventional magnetic resonance imaging system, because the gradient-magnetic-field and radio-frequency coils, which are unillustrated, are provided between the top and bottom vacuum containers, the installation spaces of the gradient-magnetic-field and radio-frequency coils prevent the superconductive coils from being brought close to the subject. Similarly, in the second conventional magnetic resonance imaging system, the installation spaces of the gradient-magnetic-field coils, the radio-frequency coils, and the cosmetic covers prevent the superconductive coils from being brought close to the subject. As discussed above, there has been a problem in that two contradictory requirements i.e., providing the subject with the feeling of not being confined and decreasing the magnetomotive force of the superconductive coils, are difficult to meet.

The present invention has been implemented in order to solve the foregoing problem, and provides a magnetic resonance imaging system in which the two contradictory requirements, i.e., enhancing the feeling of being not confined, by enlarging the subject-insertion space, and decreasing magnetomotive force of the superconductive coils by bringing the superconductive coils as close as possible to a subject, can be met in a good balance.

In a magnetic resonance imaging system, according to the present invention, that includes a superconductive electromagnetic device for generating a static magnetic field to be applied to a subject, a gradient-magnetic-field coil for forming a gradient magnetic field by tilting the magnetic-field strength of the static magnetic field, and a radio-frequency coil for transmitting a radio-frequency magnetic field to the subject and then receiving nuclear magnetic-resonance signals from the subject, a vacuum container of the superconductive electromagnetic device thereof has a recess; the gradient-magnetic-field coil and the radio-frequency coil thereof are accommodated in the recess; and a cosmetic cover that is fit with the recess and is supported by a wall surface of the recess is included therein.

According to the present invention, a magnetic resonance imaging system can be provided in which the two contradictory requirements, i.e., enhancing the feeling of being not confined by enlarging the subject-insertion space and decreasing magnetomotive force of the superconductive coils by bringing the superconductive coils as close as possible to a subject, can be met in a good balance.

DETAILED DESCRIPTION OF THE PREFERRED EMBODIMENTS

Embodiment 1

Figure 1:
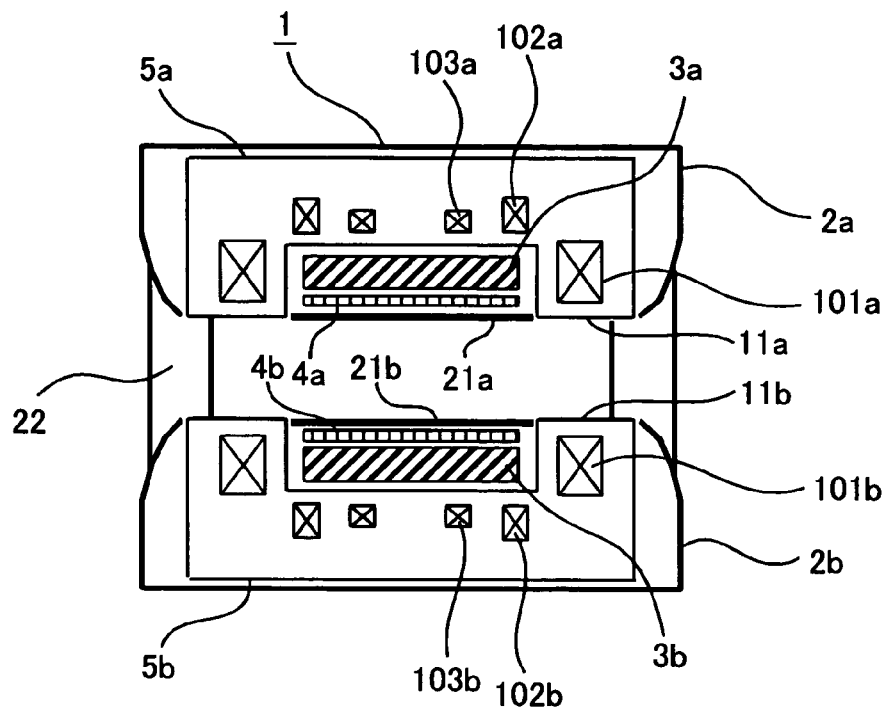
FIG. 1 is a side view of a magnetic resonance imaging system, for explaining Embodiment 1.

FIG. 1 is a side view for explaining Embodiment 1 of magnetic resonance imaging systems to which the present invention is applied.

Figure 2:
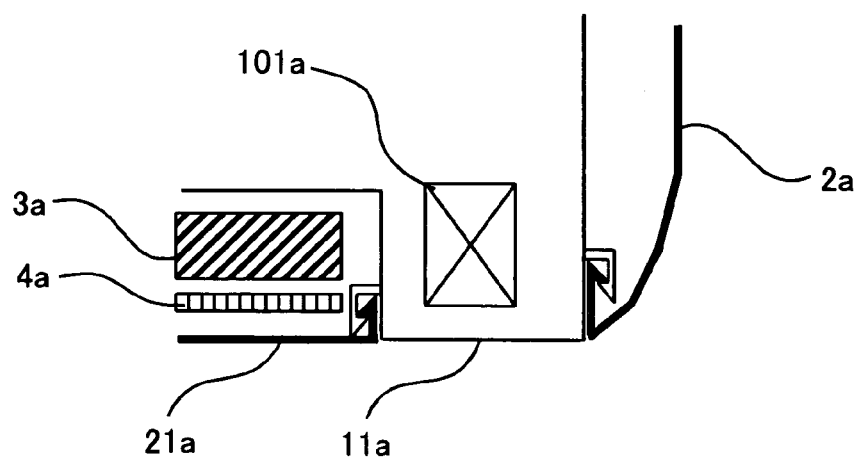
FIG. 2 is an enlarged view of principal parts in FIG. 1.

FIG. 2 is an enlarged view of principal parts in FIG. 1. The magnetic resonance imaging system according to Embodiment 1 is open-type.

A superconductive electromagnetic device 1 generating a static magnetic field to be applied to a subject is provided with superconductive coils 101a, 102a and 103a illustrated at the top side of FIG. 1, and with superconductive coils 101b, 102b and 103b illustrated at the bottom side of FIG. 1. The superconductive coils 101a through 103a are contained within a vacuum container 5a at the top side via a cooling container filled with liquid helium. Similarly, the superconductive coils 101b through 103b are contained within a vacuum container 5b at the bottom side via a cooling container filled with liquid helium. The vacuum containers 5a and 5b are facing each other, flanking the subject-insertion space with one or more support posts 22. In addition, recesses are formed along respective facing surfaces of the vacuum containers 5a and 5b.

The recess of the top vacuum container 5a contains a gradient-magnetic-field coil 3a and a radio-frequency coil 4a. In this situation, the gradient-magnetic-field coil is designed to form a gradient magnetic field by tilting the magnetic-field strength of a static magnetic field; the radio-frequency coil is designed to transmit a radio-frequency magnetic field to a subject and then to receive nuclear magnetic-resonance signals from the subject; and both are indispensable to the magnetic resonance imaging system. In general, the radio-frequency coil is arranged closer to the subject than the gradient-magnetic-field coil is. As is the case with the top side, the recess of the bottom vacuum container 5b contains a gradient-magnetic-field coil 3b and a radio-frequency coil 4b.

Because a cosmetic cover 21a made of resin of 3 to 5 mm in thickness is fit with the recess of the vacuum container 5a, the gradient-magnetic-field coil 3a and the radio-frequency coil 4a are invisible to the subject. A portion, of the facing surface of the vacuum container 5a, along which the recess is not formed, is coated with a resin sheet 11a of approximately one mm in thickness. In this situation, the surfaces of the resin sheet 11a and the cosmetic cover 21a are situated on the same plane. In other words, to the subject, the surfaces of the resin sheet 11a and the cosmetic cover 21a look to be of the same height. The outer-side and top-surface portions of the vacuum container 5a are coated with a cosmetic cover 2a of 3 to 5 mm in thickness. The thicknesses of the cosmetic covers 21a and 2a may suitably be set in terms of structural strength. The facing surfaces of the vacuum containers 5a and 5b are provided with sufficient structural strength, even merely by being covered with thin resin sheets 11a and 11b, respectively.

Referring to FIG. 2, the way in which the recess of the vacuum container 5a and the cosmetic cover 21a fit with each other will be discussed. The wall surface of the recess of the vacuum container 5a is provided with a plurality of hook-shaped locking portions. Meanwhile, the outer end of the cosmetic cover 21a is also provided with a plurality of hook-shaped locking portions, at the positions corresponding to those of the locking portions of the recess of the vacuum container 5a. Therefore, the fitting between the recess of the vacuum container 5a and the cosmetic cover 21a results in the locking between the both locking portions, whereby the cosmetic cover 21a is supported by the wall surfaces of the recess of the vacuum container 5a. Thereafter, in order to prevent the cosmetic cover 21a from falling down, the cosmetic cover 21a may be fixed to the vacuum container 5a. Moreover, the gaps between the cosmetic cover 21a and the resin sheet 11a could appropriately be sealed. This kind of locking method may be utilized in mounting the cosmetic cover 21a over the outer surface of the vacuum container 5a.

Similarly, the recess of the vacuum container 5b fits with a cosmetic cover 21b of 3 to 5 mm in thickness, and a portion, of the facing surface of the vacuum container 5b, along which the recess is not formed is coated with a resin sheet 11b of approximately one mm in thickness. The surfaces of the resin sheet 11b and the cosmetic cover 21b are situated in the same plane. The outer-side and bottom-surface portions of the vacuum container 5b are coated with a cosmetic cover 2b.

In addition, although not illustrated, the magnetic resonance imaging system is provided with a computer for processing images based on nuclear magnetic-resonance signals received by the radio-frequency coils from a subject and with a display device for displaying as tomographic images image signals processed by the computer.

In the magnetic resonance imaging system constituted in this way, the accommodation of the gradient-magnetic-field coils 3a and 3b, and the radio-frequency coils 4a and 4b in the respective recesses of the vacuum containers 5a and 5b allows the superconductive coils 101a and 101b to be close to the subject.

Moreover, the surfaces of the cosmetic covers 21a and 21b that are fit with the recesses of the vacuum containers 5a and 5b, respectively, are each at the same level as each of the adjacent surfaces of the resin sheets 11a and 11b that coat the facing surfaces of the vacuum containers 5a and 5b, respectively. In the prior art, the gradient-magnetic-field coils and the radio-frequency coils were protrusive from the facing surfaces of the vacuum containers; in addition to this, the cosmetic covers coating the gradient-magnetic-field coils and the radio-frequency coils were further more protrusive than the gradient-magnetic-field coils and the radio-frequency coils. In contrast, in the present embodiment, the gaps between the cosmetic cover 21a and the radio-frequency coil 4a and the gaps between the cosmetic cover 21b and the radio-frequency coil 4b are positioned within the respective recesses of the vacuum containers 5a and 5b. In addition, the spaces corresponding to the thicknesses of the cosmetic covers 21a and 21b are also substantially within the respective recesses of the vacuum containers 5a and 5b.

Here, the effect of accommodating within the recess of the vacuum container the gap between the cosmetic cover and the radio-frequency coil, and the space corresponding to the thickness of the cosmetic cover will be discussed. For instance, it is assumed that the gap between the cosmetic cover and the radio-frequency coil is 10 mm long; the thickness of the cosmetic cover, 5 mm thick; and the thickness of the resin sheet, one mm thick. With respect to the portion protruding from the facing surface of the vacuum container, a total of 15 mm, consisting of the 10 mm gap between the cosmetic cover and the radio-frequency coil and the 5 mm thickness of the cosmetic cover, can be reduced in the present embodiment to the one mm of the thickness of the resin sheet only. In other words, the spatial margin of 14 mm at one side, or 28 mm at both top and bottom sides, is produced.

Unless the distance between the superconductive coils 101a and 101b is changed, the distance between the vacuum containers 5a and 5b can be enlarged by the distance corresponding to the spatial margin only. In consequence, the enlarged distance provides a subject with enhanced feeling of being not confined, and the accessibility from medical practitioners to the subject is also improved. When a claustrophobic or a child is the subject, feeling of security is increased.

By keeping the distance between the vacuum containers 5a and 5b unchanged, the spatial margin can be utilized so as to make the superconductive coils 101a and 101b approach more closely to the subject. Because of the obtained result that superconductive-coil magnetomotive force is proportional to the distance, between the superconductive coils, raised to the third through fifth power, it can be estimated that the magnetomotive force may be reduced by 10% through 16%, if the distance between the superconductive coils is changed from 800 mm to 772 mm. Similar estimation for other superconductive coils 102a, 102b, 103a, and 103b can be carried out. The foregoing reduction of the magnetomotive force can reduce the quantity to be used of superconductive-wire materials, thereby resulting in cost-cutting of the superconductive electromagnetic device 1. In addition, it is possible that the values of the maximum empirical magnetic fields for the superconductive coils decrease; therefore, in that case, superconductive-wire materials having performance lower than that of conventional materials can be utilized, whereby further cost-cutting can be expected.

Meanwhile, with the decreased magnetomotive force of the superconductive coils, the electromagnetic power as between the superconductive coils can also be reduced. As a result, the walls of the vacuum containers 5a and 5b can be thinned, thereby resulting in the lightening of the product. Moreover, the reduction of the electromagnetic power thins the winding frames on which the superconductive coils are wound, thereby downsizing the cooling containers to be filled up with liquid helium. In consequence, especially in the initial cooling of the superconductive coil, the volume to be cooled is decreased; therefore, the quantity to be used of the hard-to-find liquid helium can be reduced. Furthermore, the reduction of the magnetomotive force of the superconductive coils can also curtail the quantity to be used of the superconductive-wire materials, thereby reducing the number of winding turns; therefore, man-hours can be cut back, thereby resulting in further cost-cutting of the superconductive magnet 1

Still moreover, the reduction of the electromagnetic power interacting as between the superconductive coils enables secondary effects to be obtained, such as the lightening of the structure of various kinds of constituent materials of the superconductive magnet 1. Furthermore, the downsizing of the product as a whole provides a reduced installation space as well as enhanced freedom of the installation, and the transportation of the product is facilitated. As discussed above, the ensuring of the original subject-insertion space can shorten the distance as between the superconductive coils to reduce the magnetomotive force; therefore, a considerably enhanced value of the product can be expected.

The spatial margin produced by the present embodiment may be reflected either in enlarging the subject-insertion space or in making the superconductive coils to be closer to the subject. It goes without saying that the spatial margin may be reflected not only in either one method but also in both methods sharing the spatial margin, and the share rate may be set so that the two contradictory requirements are met in a good balance.

Therefore, according to the present embodiment, a magnetic resonance imaging system can be provided in which the two contradictory requirements, i.e., enhancing the feeling of being not confined, by enlarging the subject-insertion space and decreasing magnetomotive force of the superconductive coils by bringing the superconductive coils as close as possible to the subject, can be met in a good balance.

As long as the facing surfaces of vacuum containers 5a and 5b are processed beautifully, for example, by means of mirror-surface finishing, to be able to obtain the beautiful appearances for a product, the resin sheets 11a and 11b are not necessarily required. In this case, although the vacuum containers 5a and 5b are required to be earthed, the space corresponding to the thicknesses of the resin sheets 11a and 11b can be reflected either in enlarging the subject-insertion space or in bringing the superconductive coils closer to the subject.

Embodiment 2

Figure 3:
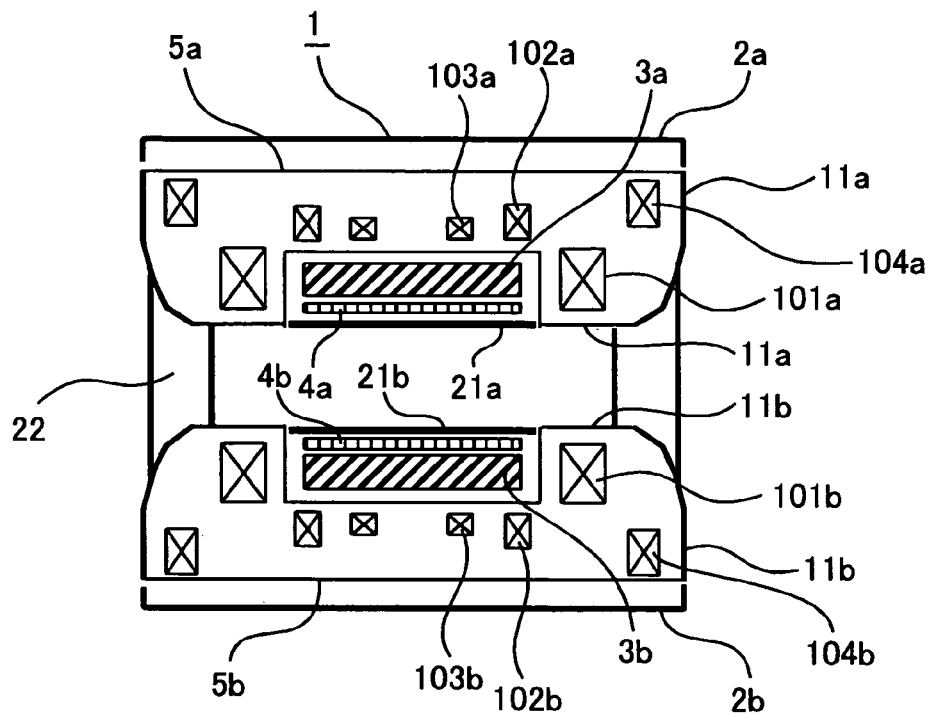
FIG. 3 is a side view of a magnetic resonance imaging system, for explaining Embodiment 2.
Figure 4:
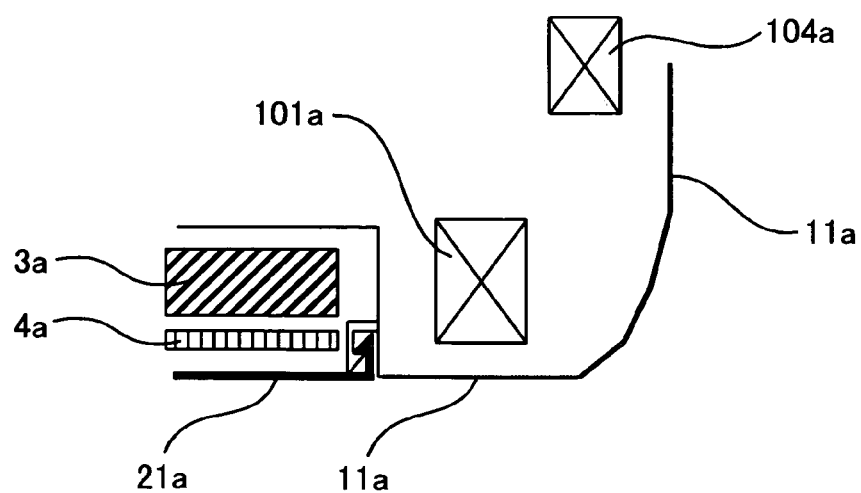
FIG. 4 is an enlarged view of principal parts in FIG. 3.

FIG. 3 is a side view of a magnetic resonance imaging system, for explaining Embodiment 2. FIG. 4 is an enlarged view of principal parts in FIG. 3. Embodiment 2 is an another aspect of Embodiment 1, wherein circumferential-surface portions of the vacuum containers 5a and 5b are also coated with the thin resin sheets 11a and 11b. In this way, in cases where a magnetic resonance imaging system is produced with the same circumferential dimensions as ever before, the circumferential dimensions of the vacuum containers 5a and 5b can be increased. In consequence, the external diameters of the superconductive coils 101a and 101b can be enlarged.

In this case, as well, an effect of decreasing the magnetomotive force of the superconductive coils is demonstrated, and a result has been obtained that the magnetomotive force is in reverse proportion to the external diameter, of the superconductive coil, raised approximately to the third power. For example, when the external diameters of the superconductive coils 101a and 101b are changed from 900 mm to 928 mm, the magnetomotive force can be reduced approximately by 9%. Moreover, it goes without saying that Embodiment 2 has the same secondary effects as those of Embodiment 1.

In addition, in cases where the superconductive electromagnetic device 1 is an active shield type having shield coils 104a and 104b, the external diameters of the shield coils 104a and 104b can be enlarged; therefore, fringe field can be made to be less than that of the conventional superconductive electromagnetic device. The fringe field is one of the main specification items for magnetic resonance imaging systems, and, in general, its maximal allowed value is 0.5 mT (5 gauss); the reduction of the fringe field brings about enhancement of the value of the products. Embodiment 3.

Figure 5:
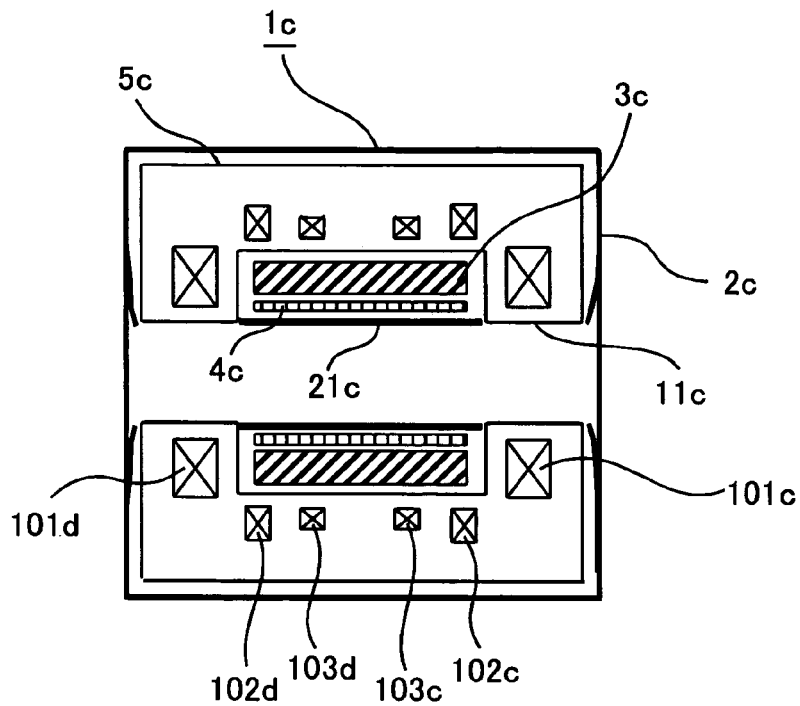
FIG. 5 is a side view of a magnetic resonance imaging system, for explaining Embodiment 3.

FIG. 5 is a side view of a magnetic resonance imaging system, for explaining Embodiment 3. The magnetic resonance imaging system according to Embodiment 3 is tunnel-type. A superconductive electromagnetic device 1c for generating a static magnetic field to be applied to a subject has a cylindrical vacuum container 5c having a bore for laying the subject thereon. The bore has a recess, along the wall surface thereof, that accommodates a gradient-magnetic-field coil 3c and a radio-frequency coil 4c. In addition, a resin-made cosmetic cover 21c is fit with the recess, being supported by the wall surface of the recess. A portion, of the wall surfaces of the bore of the vacuum container 5c, along which the recess is not formed is coated with a resin sheet 11c whose surface is positioned in the same curved surface as that of the cosmetic cover 21c.

In the present embodiment, the substantial accommodation of the gap, between the cosmetic cover 21c and radio-frequency coil 4c, and the space corresponding to the thickness of the cosmetic cover 21c within the recess of the vacuum container 5c produces a spatial margin. The spatial margin produced in this way can enhance the feeling of not being confined, by enlarging the diameter of the bore.

Moreover, by leaving the diameter of the bore as that of the conventional bore and by reducing the winding diameters of superconductive coils $101c$ and $101d$, the magnetomotive force of the superconductive coils $101c$ and $101d$ may be reduced. In this situation, experience shows that the strength of a magnetic field inside a cylindrical coil is in reverse proportion to the coil diameter raised to the second through the third power, assuming that the magnetomotive force the coil is constant. In other words, by making the magnetic-field strength in a uniform static magnetic field region constant and by reducing the winding diameters of the superconductive coils $101c$ and $101d$, the magnetomotive force can be reduced in proportion to the winding diameter raised approximately to the second through the third power. The decrease of the winding diameter in addition to the reduction of the magnetomotive force can reduce the quantity to be used of superconductive-wire materials, thereby resulting in cost-cutting of the superconductive electromagnetic device $1c$. Moreover, it goes without saying that the reduction of the magnetomotive force enables Embodiment 3 to exhibit the same secondary effects as those of Embodiment 1.

Still moreover, as is the case with Embodiment 1, the spatial margin produced by the present embodiment may be reflected either in enlarging the subject-insertion space or in making the superconductive coils to be closer to the subject. It goes without saying that the spatial margin may be reflected not only in either one method but also in both methods sharing the spatial margin, and the share rate may be set so that the two contradictory requirements are met in a good balance.

Embodiment 4

Figure 6:
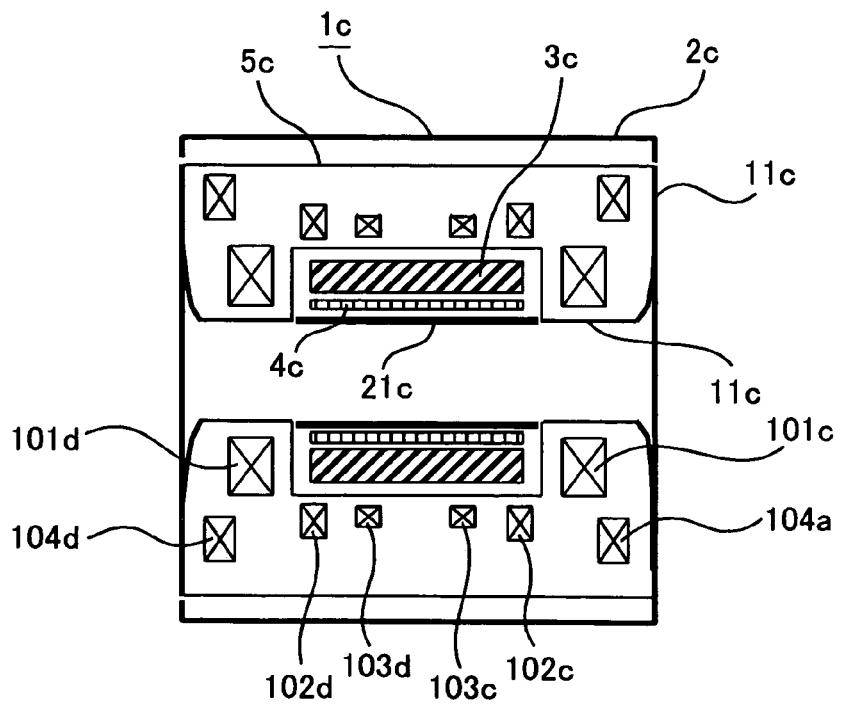
FIG. 6 is a side view of a magnetic resonance imaging system, for explaining Embodiment 4.

FIG. 6 is a side view of a magnetic resonance imaging system, for explaining Embodiment 4. Embodiment 4 is another aspect of Embodiment 3, wherein the ends of the cylinder or the vacuum containers $5c$, in Embodiment 3, are also coated with the thin resin sheets $11c$. In this way, in cases where a magnetic resonance imaging system is produced with the same axial length as ever before, the axial length of the vacuum containers $5c$ can be increased. In consequence, the superconductive coils $101c$ and $101d$ can be positioned closer to both ends of the cylinder. Meanwhile, high uniformity in the order of ppm is required of a static magnetic field for a magnetic resonance imaging system, and error components are generally cancelled out each other by combining a plurality of superconductive coils. Therefore, when the winding diameters of the superconductive coils $101c$ through $103c$, and $101d$ through $103d$ are unchanged, the larger the axial length of the vacuum container $5c$ is, the more enhanced the freedom of arrangement of these superconductive coils, whereby error components can more readily be cancelled out. Experience shows that, when the static magnetic field with a desired degree of the uniformity is obtained, the wider toward the outsides in the axial direction the possible arrangement range for the superconductive coils $101c$ and $101d$ is, the less magnetomotive force is required. The magnetomotive force is in reverse proportion to the axial-direction distance, i.e., from the center of the uniform static magnetic field to the superconductive coil $101c$ or $101d$, raised to the second through the third power. Moreover, it goes without saying that Embodiment 4 has the same secondary effects as those of Embodiment 3.

Still moreover, in cases where the superconductive electromagnetic device $1c$ is an active shield type having shield coils $104c$ and $104d$, the shield coils $104c$ and $104d$ can be arranged further closer to the ends of the cylinder; therefore, fringe field can be made to be less than that of the conventional superconductive electromagnetic device. The fringe field is one of the main specification items for magnetic resonance imaging systems, and, in general, its maximal allowed value is 0.5 mT (5 gauss); the reduction of the fringe field brings about enhancement of the value of the products.

Because this invention may be embodied in several forms without departing from the spirit of the essential characteristics thereof, the present embodiments are therefore illustrative and not restrictive, since the scope of the invention is defined by the appended claims rather than by the description preceding them, and all changes that fall within the metes and bounds of the claims, or the equivalence of such metes and bounds, are therefore intended to be embraced by the claims.

What is claimed is:

1. A magnetic resonance imaging system including a superconductive electromagnetic device for generating a static magnetic field to be applied to a subject, a gradient-magnetic-field coil for forming a gradient magnetic field by imparting a gradient to the magnetic-field strength of the static magnetic field, and a radio-frequency coil for transmitting a radio-frequency magnetic field to the subject and then receiving nuclear magnetic-resonance signals from the subject, characterized in that the superconductive electromagnetic device having at least one vacuum container having a recess; the gradient-magnetic-field coil and the radio-frequency coil accommodated in the recess; and a cosmetic cover that is fit into the recess and is supported by wall surfaces of the recess.

2. A magnetic resonance imaging system according to claim 1, wherein the superconductive electromagnetic device having two of the vacuum containers, the vacuum containers facing each other; each recess is formed along the respective facing surfaces of the vacuum containers; a portion, of the facing surface, along which the recess is not formed is coated with at least one resin sheet; and an outer surface of the resin sheet and the cosmetic cover are flushed in a same plane.

3. A magnetic resonance imaging system according to claim 2, wherein each outer-side surface of the vacuum containers are coated with the resin sheet.

4. A magnetic resonance imaging system according to claim 1, wherein the vacuum container of the superconductive electromagnetic device, is cylindrical, the vacuum container having a bore for laying the subject therein; and the recess is formed along a wall surface of the bore; a portion, of the wall surface of the bore, along which the recess is not formed is coated with resin sheet; and an outer surfaces of the resin sheet and the cosmetic cover are flushed in a same curved plane.

5. A magnetic resonance imaging system according to claim 4, wherein both ends of the cylindrical vacuum container are coated with the resin sheets.

* * * * *